(12) United States Patent
Nakanishi et al.

(10) Patent No.: US 8,652,587 B2
(45) Date of Patent: Feb. 18, 2014

(54) METHOD AND APPARATUS FOR FORMING FILM

(75) Inventors: Kazuyuki Nakanishi, Seto (JP);
Takashi Iseki, Aichi-ken (JP); Yasuhiro Ozawa, Aichi-ken (JP); Yuka Yamada, Toyota (JP); Seiji Mizuno, Nagoya (JP); Katsumi Sato, Nisshin (JP); Masafumi Koizumi, Nagoya (JP); Yoshiyuki Funaki, Kanagawa (JP); Kyouji Kondo, Kanagawa (JP); Takayuki Kikuchi, Kanagawa (JP)

(73) Assignee: Kabushiki Kaisha Toyota Chuo Kenkyusho, Aichi-gun (JP)

( * ) Notice: Subject to any disclaimer, the term of this patent is extended or adjusted under 35 U.S.C. 154(b) by 389 days.

(21) Appl. No.: 13/046,208

(22) Filed: Mar. 11, 2011

(65) Prior Publication Data

US 2011/0311736 A1    Dec. 22, 2011

(30) Foreign Application Priority Data

Jun. 18, 2010 (JP) .................................. 2010-139602

(51) Int. Cl.
*H05H 1/24* (2006.01)
(52) U.S. Cl.
USPC .......................................................... 427/569
(58) Field of Classification Search
USPC .......................................................... 427/569
See application file for complete search history.

(56) References Cited

U.S. PATENT DOCUMENTS

| 6,705,245 | B1 * | 3/2004 | Jeong et al. | 118/723 E |
| 7,294,283 | B2 * | 11/2007 | Madocks | 216/67 |
| 2005/0003098 | A1 * | 1/2005 | Kohler et al. | 427/488 |

FOREIGN PATENT DOCUMENTS

| JP | A-06-150310 | 5/1994 |
| JP | A-11-158637 | 6/1999 |
| JP | A-11-350146 | 12/1999 |
| JP | A-2000-336196 | 12/2000 |

* cited by examiner

*Primary Examiner* — Kelly M Gambetta
(74) *Attorney, Agent, or Firm* — Oliff PLC (57) ABSTRACT

This invention adopts plasma-enhanced chemical vapor deposition using the apparatus including a chamber, a pair of rotary electrode reels including a feed-out reel and a take-up reel, a plasma source, a material gas supplier, and an exhaust unit, and includes applying a negative voltage applied to the rotary electrode reels from the plasma source while a conductive substrate is fed-out from the feed-out reel and is wound on the take-up reel so that the entire surface of the substrate portion between reels contacts the material gas, whereby plasma sheath is formed along the surface of the substrate portion between reels, and the material gas is activated in the plasma sheath and thus contacts the surface of the substrate, thus forming the film on the surface of the substrate.

7 Claims, 6 Drawing Sheets

METHOD AND APPARATUS FOR FORMING FILM

TECHNICAL FIELD

The present invention relates to a method and apparatus for forming a film using plasma-enhanced chemical vapor deposition (PECVD).

BACKGROUND ART

Methods of forming a protective film using PECVD while winding a continuous substrate with a long shape are known to be for example the following patent documents. Japanese Unexamined Patent Application Publication No. 11-350146 discloses a technique for forming a protective film, including applying power to a wire-mesh anode provided in a container, and converting a material gas passing through the anode into plasma, thus forming the protective film on the surface of a substrate of a magnetic recording medium in contact with an earthed cooling rotary drum. Japanese Unexamined Patent Application Publication No. 6-150310 discloses a technique for forming a protective film using radio frequency (RF) PECVD, including generating glow discharge between a pair of parallel flat-panel electrodes provided in a container, converting a material gas into plasma, and repetitively running continuous substrate between the electrodes, thus forming the protective film on the surface of a substrate of a magnetic recording medium. Japanese Unexamined Patent Application Publication No. 2000-336196 discloses a technique for forming an antireflective film using RF PECVD, including generating glow discharge between an electrode and a temperature control drum provided in a container, and converting a material gas into plasma, thus forming the antireflective film of titanium oxide on the surface of a polymer film in contact with the temperature control drum. Japanese Unexamined Patent Application. Publication No. 11-158637 discloses a technique for forming a protective film using microwave PECVD, including providing a reactor tube for radiating plasma in a container, feeding a base film on a can roll provided at a position facing the reactor tube, and forming the protective film on the surface of the base film of a magnetic recording medium.

However, in the method disclosed in Japanese Unexamined Patent Application Publication No. 11-350146, the means for converting the material gas into plasma is provided in an anode grid at a position facing the continuous substrate. Thus, because the material gas plasma is supplied to the continuous substrate at a position apart from the continuous substrate, the area where the film is simultaneously formed is limited. Hence, in order to form a film on the entire surface of the continuous substrate or to achieve an increase in the area where a film is formed, there is a need to prepare several anode grids, and undesirably the apparatus becomes complicated and expensive. Furthermore, because the material gas is supplied through the anode grids, deposits may be formed on the anode grids due to long-term film formation, undesirably deteriorating discharge stability.

Also in the method of forming a film using RF PECVD according to Japanese Unexamined Patent Application Publication No. 6-150310 and Japanese Unexamined Patent Application Publication No. 2000-336196, the film is formed even on the counter electrode. Upon long-term film formation, there may undesirably occur the generation of dust from the film deposited on the counter electrode or the changes in film-forming conditions attributed to changes in discharge impedance. In the method of forming a film using microwave PECVD according to Japanese Unexamined Patent Application Publication No. 11-158637, the means for converting the material gas into plasma is microwave introduced into the reactor tube provided at a position facing the continuous substrate. This method supplies the material gas plasma to the substrate at a position apart from the continuous substrate, and undesirably limits the area where a film is simultaneously formed and decreases the film formation rate. Furthermore, in order to form a film on the entire surface of the continuous substrate or to increase the area where a film is formed, several reactor tubes are required, and undesirably the apparatus becomes complicated and expensive.

Moreover in the conventional techniques disclosed in these patent documents, the resin of magnetic tape or antireflective film is used for the continuous substrate, and thus there is a need to reduce thermal load on the substrate at a film-forming temperature adjusted to about 150 degree Celsius or less. To this end, plasma cannot but be formed at a position apart from the substrate. Furthermore, because the resin-made continuous substrate has no conductivity, it cannot directly supply power to electrodes, making it impossible to form plasma along the surface of the substrate.

Also, methods of forming a film while winding a continuous substrate are known to be sputtering and deposition, in addition to PECVD. However, in any method of sputtering and deposition, a material gas is supplied from a target material or an evaporation source facing the substrate. So, the area able to simultaneously form a film is limited. Furthermore, properties of the formed film may undesirably vary depending on the distance from the supply source of material gas. Moreover, when using sputtering, the film formation rate is slower compared to when using PECVD. In the case of deposition, the evaporation source is a dot-type source, and an increase in the treatment area needs a plurality of evaporation sources, and undesirably the apparatus becomes complicated and expensive.

SUMMARY OF THE INVENTION

Accordingly, the present invention has been made to solve the problems encountered in the related art, and an object of the present invention is to provide a method and apparatus for forming a film, which enables the uniform formation of a film and the increase of an area where the film is formed, and also enables simultaneous film formation on the entire surface of a substrate.

The present invention provides a method of forming a film on a surface of a conductive substrate with a long shape using an apparatus through PECVD, the apparatus comprising a chamber, a pair of rotary electrode reels disposed in the chamber and including a feed-out reel and a take-up reel, a plasma source able to apply voltage using the chamber as an anode and the rotary electrode reels as a cathode, a material gas supplier for supplying a material gas for a film into the chamber, and an exhaust unit for vacuum-evacuating the inside of the chamber, the method comprising vacuum-evacuating the inside of the chamber by means of the exhaust unit and supplying the material gas into the chamber by means of the material gas supplier, thus forming the film on the surface of the conductive substrate, wherein when the conductive substrate with a cylindrical shape wound on the feed-out reel is defined as a feed-out substrate portion, the conductive substrate with a cylindrical shape wound on the take-up reel is defined as a take-up substrate portion, and the conductive substrate positioned between the feed-out reel and the take-up reel is defined as a substrate portion between reels, a negative voltage is applied to the rotary electrode reels from the plasma source while the conductive substrate is fed-out from the feed-out reel and is wound on the take-up reel so that an entire surface of the substrate portion between reels contacts the material gas, whereby plasma sheath is formed along the surface of the substrate portion between reels and the material gas is activated in the plasma sheath and thus contacts the surface of the substrate, thus forming the film on the surface of the substrate.

In the method of forming a film according to the present invention, it is preferred that the apparatus further comprises an adjacent anode disposed in the chamber and connected with the anode of the plasma source, in which at least one surface among both end surfaces and an outer surface of the feed-out substrate portion and both end surfaces and an outer surface of the take-up substrate portion is covered with the adjacent anode so as to enable feeding-out of the conductive substrate from the feed-out reel and/or winding thereof on the take-up reel, and an electrode distance between the surface covered with the adjacent anode and the adjacent anode is made smaller than a width of the plasma sheath.

In the method of forming a film according to the present invention, the chamber may comprise a feed-out rotary electrode compartment that receives the feed-out reel, a take-up rotary electrode compartment that receives the take-up reel, and a film-forming compartment that receives the substrate portion between reels, which are divided by partitions with slits through which the conductive substrate passes, and at least one of internal pressure of the feed-out rotary electrode compartment and internal pressure of the take-up rotary electrode compartment may be controlled by the exhaust unit or a gas flow rate so that at least one electrode distance of a feed-out electrode distance between the feed-out substrate portion and the chamber or the adjacent anode, acting as the anode, and a take-up electrode distance between the take-up substrate portion and the chamber or the adjacent anode, acting as the anode, is smaller than the width of the plasma sheath.

In the method of forming a film according to the present invention, at least one of the internal pressure of the feed-out rotary electrode compartment and the internal pressure of the take-up rotary electrode compartment may be controlled depending on an increase/decrease in the feed-out electrode distance and the take-up electrode distance.

In the method of forming a film according to the present invention, the film may be an amorphous carbon film. Also, the conductive substrate may be a metal foil made of any one selected from among stainless steel, aluminum, copper and titanium.

In addition the present invention provides an apparatus for forming a film on a surface of a conductive substrate with a long shape through PECVD, comprising a chamber, a pair of rotary electrode reels disposed in the chamber and including a feed-out reel and a take-up reel, a plasma source able to apply voltage using the chamber as an anode and the rotary electrode reels as a cathode, a material gas supplier for supplying a material gas for a film into the chamber, and an exhaust unit for vacuum-evacuating the inside of the chamber, thus forming the film on the surface of the conductive substrate in the chamber which is vacuum-evacuated by means of the exhaust unit and to which the material gas is supplied by means of the material gas supplier, wherein when the conductive substrate with a cylindrical shape wound on the feed-out reel is defined as a feed-out substrate portion, the conductive substrate with a cylindrical shape wound on the take-up reel is defined as a take-up substrate portion, and the conductive substrate positioned between the feed-out reel and the take-up reel is defined as a substrate portion between reels, upon application of a negative voltage to the rotary electrode reels from the plasma source while the conductive substrate is fed-out from the feed-out reel and is wound on the take-up reel so that an entire surface of the substrate portion between reels contacts the material gas, whereby an electrode distance between the surface of the substrate portion between reels and the chamber acting as the anode is set to be larger than a width of plasma sheath formed along the surface of the substrate.

In the apparatus for forming a film according to the present invention, it is preferred that the apparatus further comprises an adjacent anode disposed in the chamber and connected with the anode of the plasma source, in which the adjacent anode covers at least one surface among both end surfaces and an outer surface of the feed-out substrate portion and both end surfaces and an outer surface of the take-up substrate portion so as to enable feeding-out of the conductive substrate from the feed-out reel and/or winding thereof on the take-up reel, and an electrode distance between the surface covered with the adjacent anode and the adjacent anode is set to be smaller than the width of the plasma sheath.

In the apparatus for forming a film according to the present invention, the chamber may comprise a feed-out rotary electrode compartment that receives the feed-out reel, a take-up rotary electrode compartment that receives the take-up reel, and a film-forming compartment that receives the substrate portion between reels, which are divided by partitions with slits through which the conductive substrate passes, and the exhaust unit may control at least one of internal pressure of the feed-out rotary electrode compartment and internal pressure of the take-up rotary electrode compartment so that at least one electrode distance of a feed-out electrode distance between the feed-out substrate portion and the chamber or the adjacent anode, acting as the anode, and a take-up electrode distance between the take-up substrate portion and the chamber or the adjacent anode, acting as the anode, is smaller than the width of the plasma sheath.

In a method of forming a film according to the present invention, while a conductive substrate is fed-out from a feed-out reel and is wound on a take-up reel, a negative voltage is applied to the rotary electrode reels, and thus the negative voltage is also applied to the conductive substrate in contact with the rotary electrode reels, thereby forming plasma sheath along the surface of the substrate. Furthermore, a material gas is activated in the plasma sheath and contacts the surface of the substrate, thus uniformly forming a film on the surface of the substrate.

Also, in the method of forming a film according to the present invention, the feeding-out and winding of the conductive substrate are performed using a pair of rotary electrode reels. Even when the axial width of the rotary electrode reels and/or the distance between the feed-out reel and the take-up reel are increased, it is possible to form a film, thus achieving an increase in the area where the film is formed. Furthermore, in the method of forming a film according to the present invention, the conductive substrate is fed-out from the feed-out reel and is wound on the take-up reel so that the entire surface of the substrate portion between reels contacts the material gas, making it possible to simultaneously form a film on the entire surface of the substrate portion between reels.

Also in the method of forming a film according to the present invention, because the film is formed while the conductive substrate is fed-out and wound between the rotary electrode reels, the conductive substrate is wound on the take-up reel along with the film formed thereon, and a novel substrate is fed from the feed-out reel. Thus, there is no case wherein the film is continuously deposited on the surface of the substrate, and furthermore, the plasma sheath is formed on the surface of the novel substrate fed from the feed-out reel. Glow discharge is therefore stably maintained. Thereby, it is possible to continuously form a uniform film on the surface of the conductive substrate with a long shape.

DESCRIPTION OF THE PREFERRED EMBODIMENTS

Hereinafter, embodiments of the present invention are described with reference to the appended drawings.

[Method of Forming a Film]
(First Embodiment)

Figure 1:
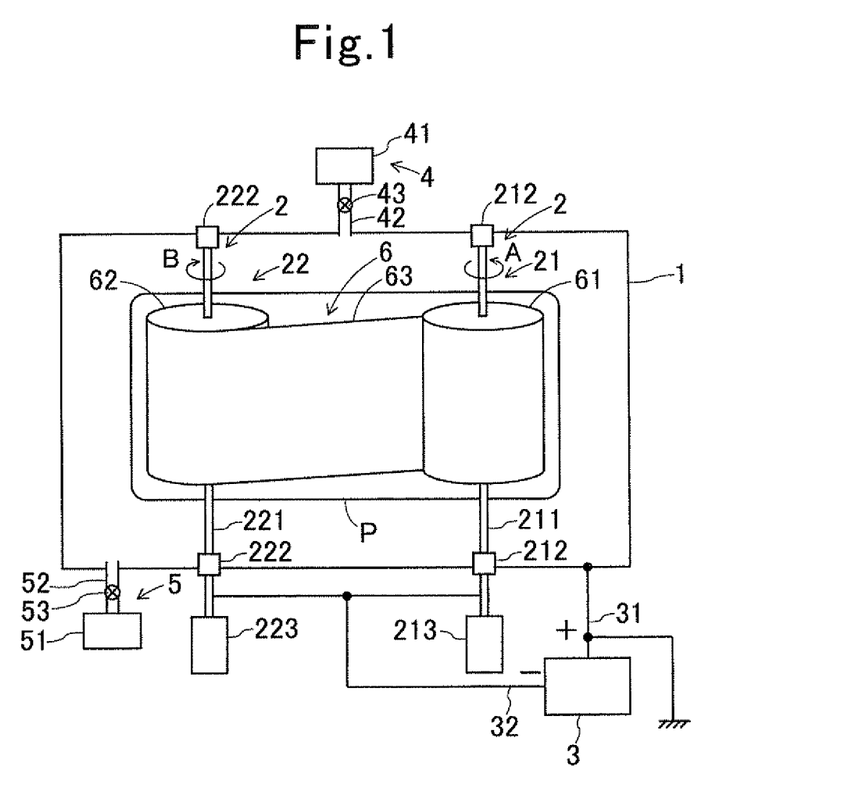
FIG. 1 schematically shows an apparatus for forming a film according to a first embodiment.

In the method of forming a film according to the present embodiment, a film is formed on the surface of a conductive substrate 6 through PECVD (more specifically direct-current (DC) PECVD) using an apparatus for forming a film which will be described below. The apparatus for forming a film according to the present embodiment is first described. FIG. 1 schematically shows the apparatus for forming a film according to the present embodiment.

The apparatus for forming a film according to the present embodiment includes a chamber 1, a pair of rotary electrode reels 2, a plasma source 3, a material gas supplier 4, and an exhaust unit 5. In addition, a temperature gauge, such as a thermocouple, an infrared radiation thermometer, etc., and/or a film thickness gauge may be appropriately provided in the apparatus for forming a film according to the present embodiment.

The chamber 1 may be airtightly vacuum-sealed. Also, the wall of the chamber 1 is conductive. The wall of the chamber 1 is connected to an anode 31 of the plasma source 3 and thus grounded (earthed).

The pair of rotary electrode reels 2 include a feed-out reel 21 that enables the feeding-out of the conductive substrate 6 (which will be described later), and a take-up reel 22 that enables the winding of the conductive substrate 6. The feed-out reel 21 includes a rotary shaft 211 which is conductive, and a pair of bearings 212, 212 having insulating and vacuum seal members. The rotary shaft 211 is rotatably maintained by means of the pair of bearings 212, 212 in the chamber 1. One end of the rotary shaft 211 extends to outside the chamber 1, and is coaxially connected with the rotary shaft of a torque control motor 213 via an insulating member, which is not shown. Furthermore, the rotary shaft 211 is connected with a cathode 32 of the plasma source 3, and is set so that a negative voltage may be applied thereto.

The take-up reel 22 includes a rotary shaft 221 that is conductive, and a pair of bearings 222, 222 having insulating and vacuum seal members. The rotary shaft 221 is rotatably maintained by means of the pair of bearings 222, 222 in the chamber 1. One end of the rotary shaft 221 extends to outside the chamber 1, and is coaxially connected with the rotary shaft of a forward rotation control motor 223 via an insulating member, which is not shown. Furthermore, the rotary shaft 221 is connected with the cathode 32 of the plasma source 3, and is set so that a negative voltage may be applied thereto.

When the rotary shaft of the forward rotation control motor 223 is rotated in a direction B (the arrow direction B shown in FIG. 1), the rotary shaft 221 of the take-up reel 22 rotates in the direction B, and the conductive substrate 6 is wound on the rotary shaft 221. Thanks to the use of the forward rotation control motor 223, the winding of the conductive substrate 6 may be carried out at a predetermined rate. As such, the rotation direction of the rotary shaft 211 of the feed-out reel 21 is a direction A (the arrow direction A shown in FIG. 1) which is reverse to the direction B. The torque control motor 213 adds a predetermined torque in the direction reverse to the rotation direction (the direction A) of the rotary shaft 211, during the winding of the conductive substrate 6. Accordingly, the tension of a substrate portion between reels (which will be described later) may be maintained constant.

The plasma source 3 includes the anode 31 and the cathode 32, and generates DC high voltage. The plasma source 3 is not particularly limited as long as it is a plasma source used in typical DC PECVD. The anode 31 is connected to the wall of the chamber 1 and thus grounded (earthed). The cathode 32 is connected to the rotary electrode reels 2.

The material gas supplier 4 includes a material gas reservoir 41 for storing a material gas for a film, a material gas supply pipe 42 for supplying a material gas to the chamber 1, and a flow rate controller 43 for controlling the supply amount of a material gas. The flow rate of the material gas is controlled by means of the flow rate controller 43 for example a mass flow controller (MFC), and the material gas is supplied into the chamber 1 via the material gas supply pipe 42.

The exhaust unit 5 includes a vacuum pump 51 for vacuum-evacuating the inside of the chamber 1, an exhaust passage 52 in which an exhaust gas flows, and an exhaust controller 53 for controlling the internal pressure of the chamber 1. The vacuum pump 51 is not particularly limited as long as it may perform vacuum evacuation. The exhaust controller 53 may include for example a valve provided to the exhaust passage 52 so that the internal pressure of the chamber 1 is adjusted by the degree of opening of the valve.

The method of forming a film according to the present embodiment forms a film on the surface of the conductive substrate 6 through PECVD using the apparatus for forming a film as above. The PECVD generates DC glow discharge between two electrodes to which high voltage is applied. When using such DC glow discharge, the material gas introduced between the electrodes is ionized, so that a thin film is deposited on the surface of the electrode (substrate) having a negative potential. As such, in order to continuously stably generate glow discharge, there is considered a need to repeat a cycle of three steps comprising (i) accelerating electrons during glow discharge toward an anode in an electric field so that they collide with gas molecules to thus ionize the gas molecules, (ii) accelerating the ionized gas molecules which are cations so that they collide with a cathode to thus emit secondary electrons from the surface of the cathode, and (iii) accelerating the emitted secondary electrons toward the anode during which they collide with gas molecules to thus ionize the gas molecules again.

The material gas may be appropriately selected depending on the kind of film to be formed, and examples thereof include a hydrocarbon gas, a mixture gas including hydrocarbon gas, a hydrocarbon-based gas, or a mixture gas including hydrocarbon-based gas. The hydrocarbon gas may include for example methane, ethylene, acetylene, hexane, benzene, toluene, etc. The hydrocarbon-based gas may include for example pyridine or aniline which contains nitrogen, tetramethylsilane which contains silicon, etc. Also, the material gas may include a diluent gas such as hydrogen, argon, helium, nitrogen, or mixtures thereof. The film resulting from using the material gas comprising a hydrocarbon gas or hydrocarbon-based gas which contains carbon may be an amorphous carbon film.

The conductive substrate 6 with a long shape is not particularly limited as long as it is conductive. It is preferred that the conductive substrate 6 is provided in the form of a thin sheet having flexibility and softness to the extent that it is able to be wound on the rotary electrode reels. For example, a metal foil made of any one selected from among stainless steel, aluminum, copper and titanium may be used. The thickness of the conductive substrate 6, which does not affect a width of plasma sheath, is 0.001~0.5 mm, and preferably 0.01~0.2 mm.

Also in the present invention, the conductive substrate 6 with a cylindrical shape which is wound on the feed-out reel 21 is defined as a feed-out substrate portion 61, and the conductive substrate 6 with a cylindrical shape which is wound on the take-up reel 22 is defined as a take-up substrate portion 62. Furthermore, the conductive substrate 6 positioned between the feed-out reel 21 and the take-up reel 22 is defined as a substrate portion 63 between reels. In the apparatus for forming a film used in the present embodiment, an electrode distance between the surface of the substrate portion 63 between reels, which acts as a cathode, and the chamber 1 acting as an anode is set to be larger than the width of the plasma sheath (which will be described later) formed along the surface of the substrate.

A film-forming temperature may include temperature conditions typically used when forming a film using PECVD, and is preferably 300~600 degree Celsius. As such, the term "film-forming temperature" indicates the temperature at the surface of the conductive substrate 6. If the film-forming temperature is lower than 300 degree Celsius, film formation rate becomes slow, and the adhesion between the conductive substrate 6 and the film becomes decreased. In contrast, if the film-forming temperature is higher than 600 degree Celsius, an intermediate layer may be formed due to the reaction between the conductive substrate 6 and the film, thus changing the properties of the film, and the formed film may become granulated, undesirably damaging a compact property.

Upon film formation, the pressure is preferably 1~1000 Pa, and more preferably 5~500 Pa. If the pressure is lower than 1 Pa upon film formation, discharge current is reduced, and the film formation rate may become slow, undesirably resulting in decreased productivity. In contrast, if the pressure is higher than 1000 Pa upon film formation, the generation of glow discharge becomes instable, and it is difficult to generate uniform glow discharge on the large area. When the pressure is 5~500 Pa upon film formation, the film formation rate is not reduced and stable glow discharge is generated.

Upon film formation, the applied voltage is preferably 200 V or more, and more preferably 250 V or more. If the applied voltage is lower than 200 V upon film formation, it is difficult to decompose the material gas, and the film formation rate is decreased, undesirably resulting in lowered productivity. In contrast, as the applied voltage is higher upon film formation, the decomposition of the material gas is promoted. When the applied voltage is 1000 V or more upon film formation, the film-forming temperature may be lower than 500 degree Celsius. Furthermore, when the applied voltage is 2000 V or more upon film formation, the film-forming temperature may be reduced to lower than 450 degree Celsius. So, in the case where an amorphous carbon film is formed, it may result in a compact film.

Next, the method of forming a film according to the present embodiment is described. First, the conductive substrate 6 is set on the apparatus for forming a film as above. One end of the conductive substrate 6 is wound on the feed-out reel 21, and the other end thereof is fixed to the take-up reel 22. Subsequently, the inside of the chamber 1 is vacuum-evacuated until a predetermined degree of vacuum is obtained. After vacuum evacuation, the material gas is supplied into the chamber 1 by means of the material gas supplier 4. When a predetermined treatment pressure is ensured, a predetermined negative voltage is applied to the rotary electrode reels 2 using the chamber 1 as an anode from the plasma source 3. The forward rotation control motor 223 is operated at a predetermined rpm, and the torque control motor 213 is operated so that the tension of the conductive substrate 6 upon winding is made uniform. Accordingly, while predetermined tension is applied to the substrate portion 63 between reels, the conductive substrate 6 is fed-out from the feed-out reel 21 and is wound on the take-up reel 22.

When the negative voltage is applied to the rotary electrode reels 2, the negative voltage is also applied to the conductive substrate 6 in contact with the rotary electrode reels 2, and thus negative glow discharge is generated between the chamber 1 serving as an anode and the conductive substrate 6, so that uniform plasma sheath P is formed along the surface of the conductive substrate 6. In the present embodiment, the plasma sheath P is formed along both axial end surfaces and the outer surface of the feed-out substrate portion 61, both axial end surfaces and the outer surface of the take-up substrate portion 62, and the entire surface of the substrate portion 63 between reels. The material gas for a film supplied into the chamber 1 is activated in the plasma sheath P around the surface of the substrate and thus contacts the surface of the substrate, thereby uniformly forming a film on the surface of the substrate. As used therein, the term "activation" means that for example the material gas is ionized or excited in the plasma sheath P to thus be converted into ions and radicals, and the term "contact" means that for example the ions collide with the surface of the substrate to thus deposit radicals on the surface of the substrate. In addition, a variety of phenomena caused upon forming a film on the surface of the conductive substrate 6 by PECVD are included, but the present invention is not limited thereto.

In the present embodiment, the conductive substrate 6 is fed-out from the feed-out reel 21 and is wound on the take-up reel 22 so that the entire surface of the substrate portion 63 between reels contacts the material gas, and thereby the film may be simultaneously formed on the entire surface of the substrate portion 63 between reels. Also in the present embodiment, because the plasma sheath P is formed along both axial end surfaces and the outer surface of the feed-out substrate portion 61, and both axial end surfaces and the outer surface of the take-up substrate portion 62, the film is further formed on both axial end surfaces and the outer surface of the feed-out substrate portion 61, and both axial end surfaces and the outer surface of the take-up substrate portion 62.

According to conventional techniques, a film was formed by supplying a material gas, which was converted into plasma, to a continuous substrate at a position apart from the continuous substrate. On the other hand, in the method of forming a film according to the present embodiment, the plasma sheath P is formed along the surface of the conductive substrate 6, and the material gas is activated in the plasma sheath P, thus forming a film. Also in the method of forming a film according to the present embodiment, because the feeding-out and winding of the conductive substrate 6 are carried out using the pair of rotary electrode reels 2, even when the axial width of the rotary electrode reels 2 and/or the distance between the feed-out reel 21 and the take-up reel 22 is increased, it is possible to form a film. Hence, the method of forming a film according to the present embodiment may achieve an increase in the area where the film is formed. Furthermore, in the method of forming a film according to the present embodiment, because film formation is accomplished while the conductive substrate 6 is fed-out and wound between the rotary electrode reels 2, the substrate is wound on the take-up reel 22 along with the film formed thereon, and a novel substrate is fed from the feed-out reel 21. Therefore, there is no case where the film is continuously deposited on the surface of the substrate, and the plasma sheath P is formed on the surface of the novel substrate fed from the feed-out reel 21. Thereby, stable glow discharge is maintained, making it possible to continuously form a uniform film on the surface of the conductive substrate 6 with a long shape.

Also in the method of forming a film according to the present embodiment, the film is seldom formed on the chamber 1 which is a counter electrode (anode), and the material gas is effectively consumed, and thus a rapid film formation rate may result. Furthermore, even when film formation is performed for a long period of time, the film is seldom formed on the chamber 1, and thus the generation of dust by a film deposited on the chamber 1 may be prevented. Therefore, it is difficult to cause problems such as changes in film-forming conditions in response to the discharge impedance changed by dust due to the film deposited on the chamber 1.

In the method of forming a film according to the present embodiment, the negative voltage is applied using the conductive substrate 6 as the cathode, and thus the cations of gas molecules ionized by glow discharge collide with the surface of the substrate. Therefore, ion impact by cations of the gas molecules may be applied to the surface of the substrate. The surface of the substrate is cleaned by ion impact. Moreover, the adhesion between the film and the conductive substrate 6 is enhanced by heat generated upon collision of the cations with the surface of the substrate. Also, ion impact may be applied upon film formation, thus enabling the control of structure of the film.

(Second Embodiment)

Figure 2:
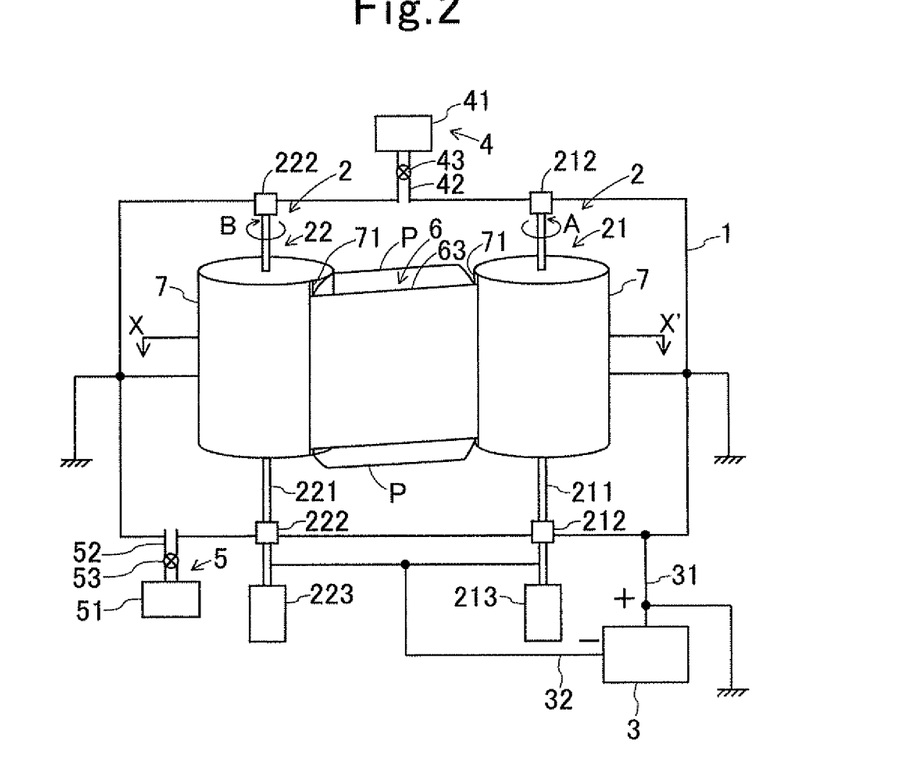
FIG. 2 schematically shows an apparatus for forming a film according to a second embodiment.

A method of forming a film according to the present embodiment is different in terms of the following description from the method and apparatus for forming a film according to the first embodiment. FIG. 2 schematically shows an apparatus for forming a film according to the second embodiment.

The apparatus for forming a film according to the present embodiment further includes a pair of adjacent anodes 7, 7 having conductivity in the chamber 1. Respective adjacent anodes 7 cover a feed-out substrate portion 61 which is not shown and a take-up substrate portion 62 which is not shown, and are maintained by means of a holding member which is not shown on the wall of the chamber 1. Respective adjacent anodes 7 are connected with the wall of the chamber 1 and the anode 31 of a plasma source 3.

The adjacent anodes 7 are made of a metal, and include a circular bottom, a circular top, and a cylindrical body. Respective adjacent anodes 7 cover both axial end surfaces and the outer surface of the feed-out substrate portion 61, and both axial end surfaces and the outer surface of the take-up substrate portion 62. Each of the adjacent anodes 7 has a gate 71 having a slit through which the conductive substrate 6 passes in the cylindrical body thereof. The gates 71 enable the conductive substrate 6 to be fed-out from the feed-out reel 21 and to be wound on the take-up reel 22. In cases where the feed-out substrate portion 61 and the take-up substrate portion 62 are covered with the adjacent anodes 7, the gates 71 allow the conductive substrate 6 to be fed-out and wound. The other structures are the same as in the apparatus for forming a film shown in FIG. 1.

Figure 3:
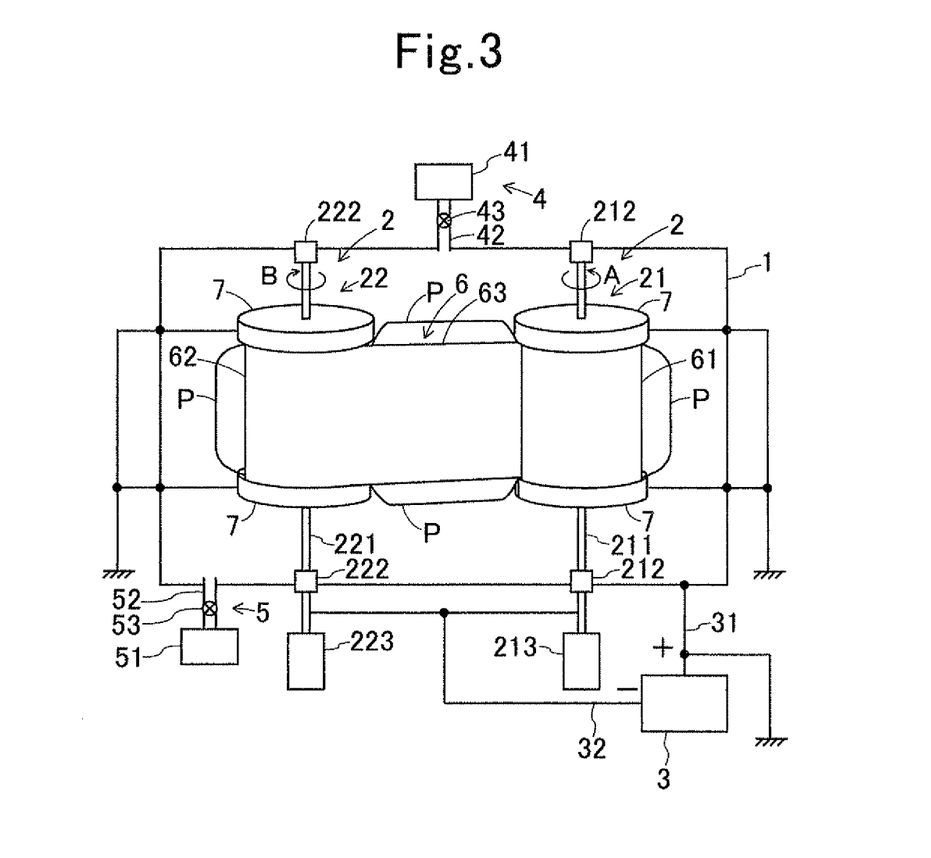
FIG. 3 schematically shows an apparatus for forming a film according to a modification of the second embodiment.

FIG. 3 schematically shows an apparatus for forming a film according to a modification of the second embodiment. The apparatus for forming a film according to the present embodiment is different in terms of the outer surface of the feed-out substrate portion 61 and the outer surface of the take-up substrate portion 62 not being covered with the adjacent anodes 7, 7, from the apparatus for forming a film shown in FIG. 2. Specifically, each of the adjacent anodes 7 includes a pair of approximate disks which cover one axial end surface and the other axial end surface of the feed-out substrate portion 61 (or the take-up substrate portion 62). Thus in this apparatus for forming a film, both axial end surfaces of the feed-out substrate portion 61 and the both axial end surfaces of the take-up substrate portion 62 are covered with the adjacent anodes 7, 7. The other structures are the same as in the apparatus for forming a film shown in FIG. 2.

In the method of forming a film according to the present embodiment, at least one surface among both end surfaces and the outer surface of the feed-out substrate portion 61, and both end surfaces and the outer surface of the take-up substrate portion 62 is covered with the adjacent anode 7. Specifically, in the apparatus as shown in FIG. 2, all of both end surfaces and the outer surface of the feed-out substrate portion 61 and both end surfaces and the outer surface of the take-up substrate portion 62 are covered with the adjacent anodes 7, and in the apparatus as shown in FIG. 3, both end surfaces of the feed-out substrate portion 61 and both end surfaces of the take-up substrate portion 62 are covered with the adjacent anodes 7. In addition to the apparatuses shown in FIGS. 2 and 3, for example it is possible to cover either the feed-out substrate portion 61 or the take-up substrate portion 62 with the adjacent anode 7. Alternatively, only the outer surface of the feed-out substrate portion 61 and/or the take-up substrate portion 62 may be covered with the adjacent anode 7. Alternatively, only one axial end surface of the feed-out substrate portion 61 and/or the take-up substrate portion 62 may be covered.

As used herein, the term "cover" means that the adjacent anodes 7 are disposed so that at least one surface among both end surfaces and the outer surface of the feed-out substrate portion 61 and both end surfaces and the outer surface of the take-up substrate portion 62 faces one surface of the adjacent anodes 7. The method of forming a film according to the present embodiment is characterized in that the electrode distance between the surface covered with the adjacent anode 7 and the adjacent anode 7 is made smaller than the width of the plasma sheath.

Typically, the term "plasma sheath" indicates a region where light emission from the surface of a cathode to negative glow is weak. As described above, in order to stably continue glow discharge using the wall of the chamber 1 as an anode and the conductive substrate 6 as a cathode and to continuously form the plasma sheath P near the surface of the conductive substrate 6, there is a need to repeat a cycle of three steps comprising (i)~(iii) as above. The energy and electrons required to maintain the glow discharge are obtained by the electric field between the electrodes. When the electrode distance between the cathode and the anode is much smaller than the plasma sheath, the electrons are not sufficiently accelerated, and kinetic energy cannot be ensured to the extent of exciting the gas molecules. So, the glow discharge becomes weak, and furthermore is not formed. As used herein, the term "width of plasma sheath" indicates a width of the region where light emission from the surface of the conductive substrate 6 serving as a cathode to negative glow is weak.

Figure 4A:
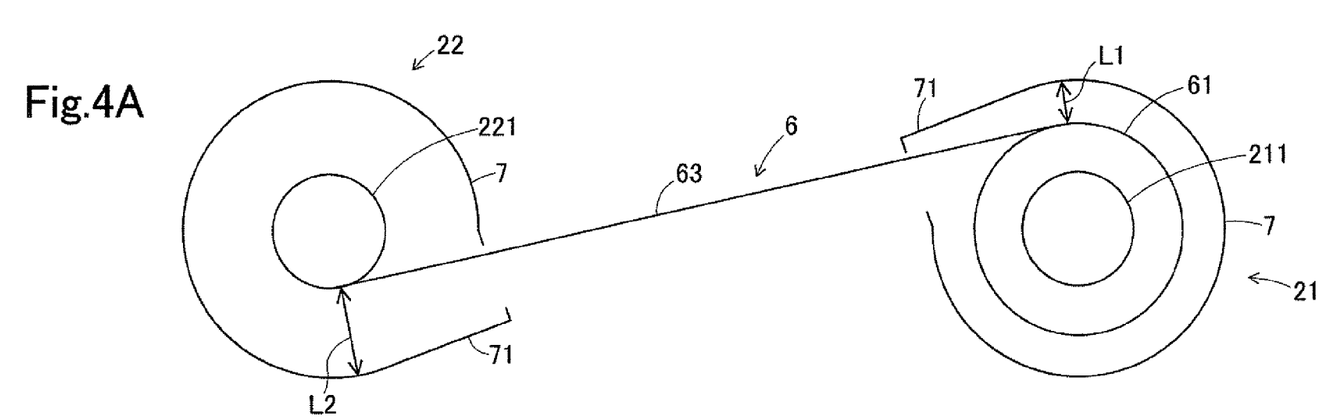
FIG. 4A schematically shows the cross-section taken along the line X-X' of FIG. 2, in which represents initiation of winding of a conductive substrate.
Figure 4B:
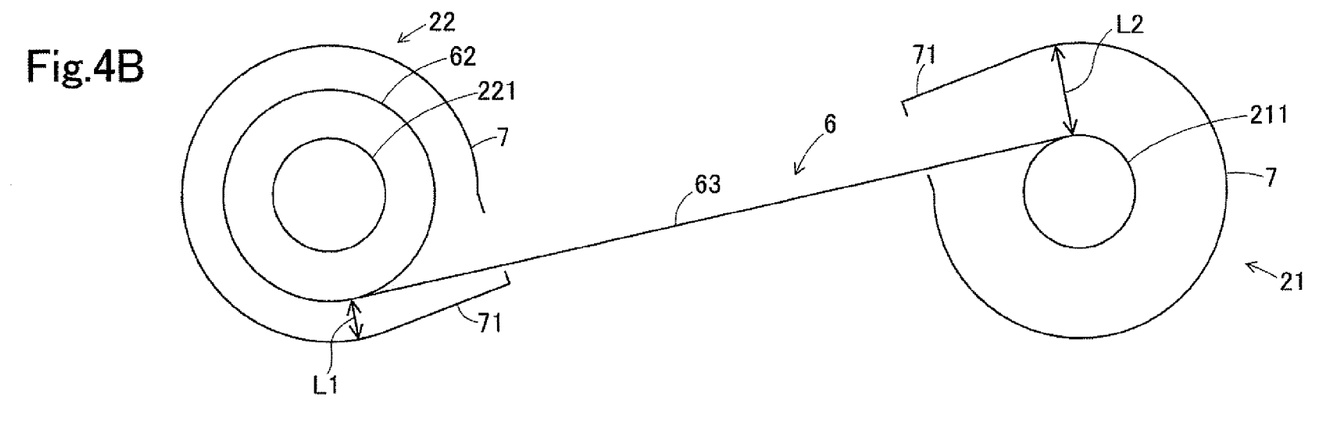
FIG. 4B schematically shows the cross-section taken along the line X-X' of FIG. 2, in which represents termination of winding of the conductive substrate.

In the method of forming a film according to the present embodiment, the electrode distance between the surface covered with the adjacent anode 7 and the adjacent anode 7 is made smaller than the width of the plasma sheath, so that the plasma sheath P is not formed on the surface of the substrate covered with the adjacent anode 7. Therefore, film formation on the surface of the substrate covered with the adjacent anode 7 is suppressed. The description is given when using for example the apparatus for forming a film as shown in FIG. 2. FIG. 4A shows the cross-section taken along the line X-X' of FIG. 2, in which represents initiation of winding of the conductive substrate 6. FIG. 4B shows the cross-section taken along the line X-X' of FIG. 2, in which represents termination of winding of the conductive substrate 6.

In FIG. 4A, upon initiation of winding of the conductive substrate 6, the conductive substrate 6 is wound on the rotary shaft 211 of the feed-out reel 21, and the distance between the outer surface of the feed-out substrate portion 61 and the adjacent anode 7 is L1. Furthermore, one end of the conductive substrate 6 is fixed to the rotary shaft 221 of the take-up reel 22, and the distance between the one end of the conductive substrate 6 and the adjacent anode 7 is L2. Briefly, upon initiation of the winding of the conductive substrate 6, the maximum distance between the outer surface of the conductive substrate 6 and the adjacent anode 7 is L2.

In FIG. 4B showing termination of the winding of the conductive substrate 6 after feeding-out and winding of the conductive substrate 6, the conductive substrate 6 is entirely wound on the rotary shaft 221 of the take-up reel 22, and the distance between the outer surface of the take-up substrate portion 62 and the adjacent anode 7 is L1. Also, one end of the conductive substrate 6 is fixed to the rotary shaft 211 of the feed-out reel 21, and the distance between the one end of the conductive substrate 6 and the adjacent anode 7 is L2. Briefly, upon termination of the winding of the conductive substrate 6, the maximum distance between the outer surface of the conductive substrate 6 and the adjacent anode 7 is L2. During the feeding-out and winding of the conductive substrate 6, the distance between the outer surface of the conductive substrate 6 and the adjacent anode 7 falls in the range of L1~L2 even for any one of the feed-out reel 21 and the take-up reel 22.

When the negative voltage is applied to the feed-out reel 21 and the take-up reel 22, the feed-out substrate portion 61 and the take-up substrate portion 62 act as a cathode, and the adjacent anode 7 acts as an anode. The electrode distance between the outer surface of the feed-out substrate portion 61 and the adjacent anode 7 from initiation of winding of the conductive substrate 6 to termination thereof falls in the range of L1~L2, and the maximum electrode distance is L2. Also, the electrode distance between the outer surface of the take-up substrate portion 62 and the adjacent anode 7 from initiation of winding of the conductive substrate 6 to termination thereof falls in the range of L1~L2, and the maximum electrode distance is L2. Thus, the conductive substrate 6 is covered with the adjacent anode 7 so that the maximum electrode distance L2 is smaller than the width of the plasma sheath. Thereby, the plasma sheath P is not formed on the outer surfaces of the feed-out substrate portion 61 and take-up substrate portion 62, which are covered with the adjacent anodes 7, and thus a film is not formed thereon.

On both axial end surfaces of the feed-out substrate portion 61 and the take-up substrate portion 62, the axial end surface is covered with the adjacent anode 7 so that the electrode distance between the axial end surface and the adjacent anode 7 is smaller than the width of plasma sheath. Thereby, the plasma sheath P is not formed on the axial end surfaces of the feed-out substrate portion 61 and take-up substrate portion 62, which are covered with the adjacent anodes 7, and thus a film is not formed thereon.

Next, the method of forming a film is described using the apparatus for forming a film as shown in FIG. 2. This method is the same as in the method of forming a film according to the first embodiment, with the exception that the plasma sheath P and the film are formed in different places as in the first embodiment. According to the present embodiment, the plasma sheath P is formed only along the entire surface of the substrate portion 63 between reels. Because the feed-out substrate portion 61 and the take-up substrate portion 62 are completely covered with the adjacent anodes 7, the plasma sheath P is not formed on both axial end surfaces and the outer surface of the feed-out substrate portion 61 and both axial end surfaces and the outer surface of the take-up substrate portion 62. The material gas for a film supplied into the chamber 1 is activated in the plasma sheath P on the surface of the substrate portion 63 between reels and thus contacts the surface of the substrate, thereby uniformly forming a film on the surface of the substrate portion 63 between reels. The conductive substrate 6 is fed-out from the feed-out reel 21 and is wound on the take-up reel 22 so that the entire surface of the substrate portion 63 between reels contacts the material gas, making it possible to simultaneously form the film on the entire surface of the substrate portion 63 between reels.

Typically, the feed-out substrate portion 61 and the take-up substrate portion 62, which are in a state in which the conductive substrate 6 is wound on the rotary electrode reels 2, and the substrate portion 63 between reels in which the conductive substrate 6 is not wound on the rotary electrode reels 2 have slightly different properties of the conductive substrate 6 upon film formation. For example, the feed-out substrate portion 61 and the take-up substrate portion 62 have different thermal capacities from the substrate portion 63 between reels, and thus the surface temperature of the substrate becomes slightly different upon film formation. Furthermore, the feed-out substrate portion and the take-up substrate portion 62 comprise the conductive substrate 6 which is wound on the rotary electrode reels 2 and thus warps, thus causing stress on the conductive substrate 6. If a film is formed on the outer surface or the like of the feed-out substrate portion 61 and the take-up substrate portion 62, there is a worry about the properties of this film differing from properties of the film formed on the surface of the substrate portion 63 between reels.

In the present embodiment using the apparatus of FIG. 2, the feed-out substrate portion 61 and the take-up substrate portion 62 are completely covered with the adjacent anodes 7, and thereby the range where a film is formed may be confined to the substrate portion 63 between reels which is not wound on the rotary electrode reels 2. Therefore, the properties of the resulting film are made uniform.

Next, the method of forming a film is described using the apparatus for forming a film as shown in FIG. 3. This method is the same as in the method of forming a film according to the first embodiment, with the exception that the plasma sheath P and the film are formed in different places as in the first embodiment. According to this embodiment, the plasma sheath P is formed along the outer surface of the feed-out substrate portion 61, the outer surface of the take-up substrate portion 62, and the entire surface of the substrate portion 63 between reels. Because both axial end surfaces of the feed-out substrate portion 61 and both axial end surfaces of the take-up substrate portion 62 are covered with the adjacent anodes 7, the plasma sheath P is not formed on both axial end surfaces of the feed-out substrate portion 61 and both axial end surfaces of the take-up substrate portion 62. The material gas for a film supplied into the chamber 1 is activated in the plasma sheath P on the surface of the conductive substrate 6 and thus contacts the surface of the substrate, thereby uniformly forming a film on the surface of the conductive substrate 6. The conductive substrate 6 is fed-out from the feed-out reel 21 and is wound on the take-up reel 22 so that the entire surface of the substrate portion 63 between reels contacts the material gas, making it possible to simultaneously form the film on the entire surface of the substrate portion 63 between reels. Also according to this embodiment using the apparatus of FIG. 3, the plasma sheath P is not formed on both axial end surfaces of the feed-out substrate portion 61 and both axial end surfaces of the take-up substrate portion 62, and thus the film formation on both axial end surfaces of the feed-out substrate portion 61 and both axial end surfaces of the take-up substrate portion 62 is suppressed.

In the present embodiment, film formation at positions other than the surface of the conductive substrate 6 may be prevented. The film may be prevented from being deposited on both axial end surfaces of the feed-out substrate portion 61 and both axial end surfaces of the take-up substrate portion 62 due to long-term film formation. Therefore, it is possible to prevent deterioration of quality of the film attributed to generation of dust by the scattering of the deposited film. Moreover, because the film is not formed on any position other than the surface of the substrate, the material gas is not wasted.

(Third Embodiment)

Figure 5:
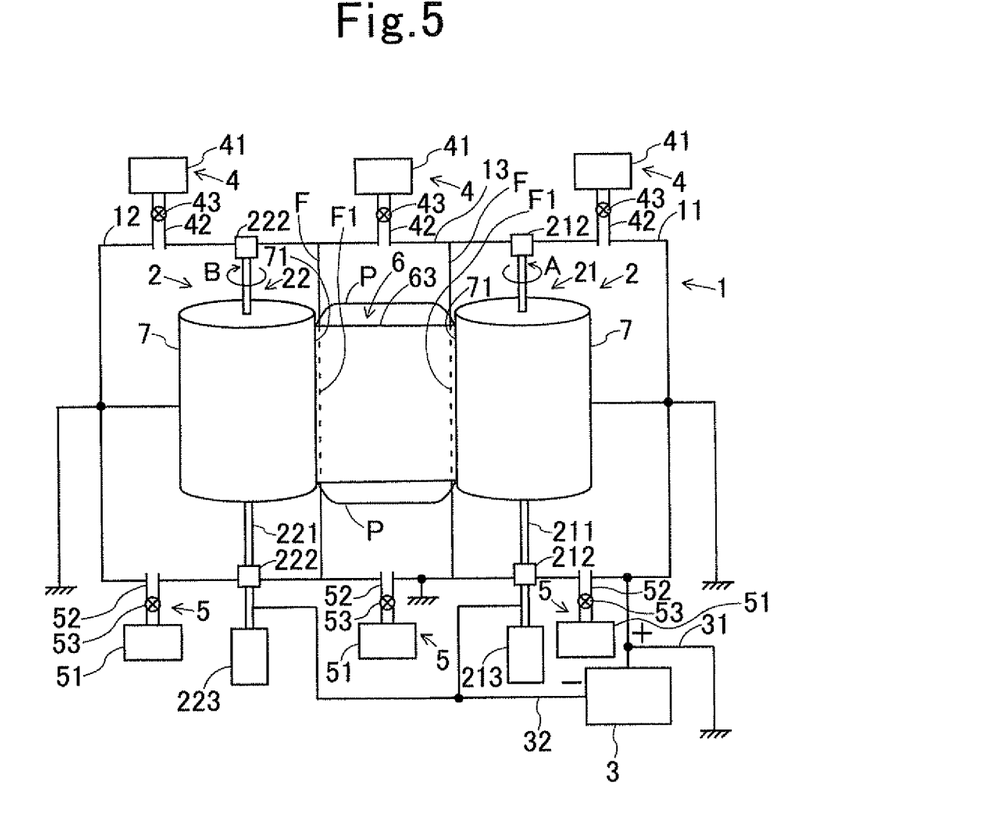
FIG. 5 schematically shows an apparatus for forming a film according to a third embodiment.

A method of forming a film according to the present embodiment is different in terms of the following description from the method and apparatus for forming a film according to the second embodiment. FIG. 5 schematically shows an apparatus for forming a film according to the third embodiment.

A chamber 1 includes a feed-out rotary electrode compartment 11 that receives a feed-out reel 21, a take-up rotary electrode compartment 12 that receives a take-up reel 22, and a film-forming compartment 13 that receives a substrate portion 63 between reels, which are divided by two partitions F, F. The partitions F are made of a metal, and portions thereof are opened, and slit-forming members F1 made of an insulating material are inserted and maintained into the opened portions. The slit-forming members F1 have slits through which the conductive substrate 6 passes, and the partitions F are insulated from the conductive substrate 6 which passes through the slits thereof. The slits are opened to the extent that they may suppress changes in pressure of the feed-out rotary electrode compartment 11 and the take-up rotary electrode compartment 12 so that the maximum electrode distance (which will be described later) becomes smaller than a width of plasma sheath even when there is inflow of the material gas in the feed-out rotary electrode compartment 11 and the take-up rotary electrode compartment 12. Also, the slits are opened to the extent that they may suppress changes in pressure of the film-forming compartment 13 so that the electrode distance between the substrate portion 63 between reels and the film-forming compartment 13 becomes larger than a width of plasma sheath formed along the surface of the substrate even when there is outflow of the material gas from the film-forming compartment 13. When using a conductive substrate 6 having a thickness of 150 μm and a width of 100 mm, the slit may be formed in a size of about 2 mm in the direction of the thickness of the conductive substrate 6 and about 120 mm in the direction of the width thereof.

Material gas supply pipes 42, 42, 42 are respectively connected to the compartments 11, 12, 13 so that material gas suppliers 4, 4, 4 function to independently supply a material gas and a diluent gas to respective compartments 11, 12, 13. In the present embodiment, the material gas supplied into the film-forming compartment 13 may be composed of a hydrocarbon gas, a mixture gas including hydrocarbon gas, a hydrocarbon-based gas, or a mixture gas including hydrocarbon-based gas as mentioned above, or may include a diluent gas as above. It is the diluent gas and not the hydrocarbon gas or the like that is supplied to the feed-out rotary electrode compartment 11 and the take-up rotary electrode compartment 12.

The apparatus of FIG. 5 has three material gas suppliers 4. However, a single material gas supplier 4 may be provided and a material gas supply pipe 42 may be connected only to the film-forming compartment 13. In this case, the material gas supplied into the film-forming compartment 13 may include the hydrocarbon gas or the like, and may include the diluent gas.

Also, respective compartments 11, 12, 13 are provided with exhaust units 5, so that the internal pressure of each compartment 11, 12, 13 may be controlled. The control of the internal pressure is performed using exhaust controllers 53. Each exhaust controller 53 includes for example a valve provided to an exhaust passage 52, so that the internal pressure is controlled by the degree of opening of the valve. Alternatively, the control of the internal pressure may be performed using a gas flow rate. The other structures are the same as in the apparatus forming a film as shown in FIG. 2.

The method of forming a film according to the present embodiment is characterized in that, using the apparatus for forming a film as above, both the internal pressure of the feed-out rotary electrode compartment 11 and the internal pressure of the take-up rotary electrode compartment 12 are controlled by means of the exhaust units 5, 5 or the gas flow rate, so that the maximum electrode distance which is a maximum value of both electrode distances including the feed-out electrode distance between the feed-out substrate portion 61 and the adjacent anode 7 and the take-up electrode distance between the take-up substrate portion 62 and the adjacent anode 7 is smaller than the width of plasma sheath.

When the internal pressure is increased, the width of the plasma sheath is reduced. In contrast, when the internal pressure is decreased, the width of the plasma sheath is increased. Thus, the internal pressure of the feed-out rotary electrode compartment 11 which receives the feed-out reel 21 and the internal pressure of the take-up rotary electrode compartment 12 that receives the take-up reel 22, which are undesired to form a film, are reduced, whereby the width of the plasma sheath may become larger in the feed-out rotary electrode compartment 11 and the take-up rotary electrode compartment 12. Upon film formation, as the winding of the conductive substrate 6 progresses, the feed-out electrode distance between the outer surface of the feed-out substrate portion 61 and the adjacent anode 7 and the take-up electrode distance between the outer surface of the take-up substrate portion 62 and the adjacent anode 7 are changed. In order to make the maximum electrode distance which is a maximum value of both electrode distances be smaller than the width of plasma sheath upon film formation, the internal pressure of the feed-out rotary electrode compartment 11 and the internal pressure of the take-up rotary electrode compartment 12 are set to be low. Thereby, the plasma sheath P is not formed on the outer surface of the feed-out substrate portion 61 and the outer surface of the take-up substrate portion 62, whereas the plasma sheath P may be formed only on the surface of the substrate portion 63 between reels, thus forming a film only on the substrate portion 63 between reels. Below, the method of forming a film according to the present embodiment is described in detail.

The conductive substrate 6 is set on the apparatus for forming a film as above. One end of the conductive substrate 6 is wound on the feed-out reel 21, and the other end thereof is fixed to the take-up reel 22. Subsequently, the feed-out rotary electrode compartment 11, the take-up rotary electrode compartment 12, and the film-forming compartment 13 are respectively vacuum-evacuated until a predetermined degree of vacuum is obtained by means of the exhaust units 5, 5, 5. After vacuum evacuation, the material gas including the diluent gas is supplied into the film-forming compartment 13 by means of the material gas supplier 4, and the diluent gas is supplied into the feed-out rotary electrode compartment 11 and the take-up rotary electrode compartment 12 by means of the material gas suppliers 4, 4. In the present embodiment, all of both end surfaces and the outer surface of the feed-out substrate portion 61, which is not shown, and both end surfaces and the outer surface of the take-up substrate portion 62, which is not shown, are covered with the adjacent anodes 7, thus suppressing the film formation on the feed-out substrate portion 61 and the take-up substrate portion 62, as will be described later. However, there is probability of attaching the material gas component to the surface of the conductive substrate 6 in the feed-out rotary electrode compartment 11 and the take-up rotary electrode compartment 12. Hence, when the diluent gas is supplied to the feed-out rotary electrode compartment 11 and the take-up rotary electrode compartment 12, attachment of the material gas component to the surface of the conductive substrate 6 in the feed-out rotary electrode compartment 11 and the take-up rotary electrode compartment 12 may be prevented.

The internal pressure of both the feed-out rotary electrode compartment 11 and the take-up rotary electrode compartment 12 is adjusted by means of the exhaust units 5, 5 so that the maximum electrode distance is smaller than the width of the plasma sheath. The internal pressure of the film-forming compartment 13 is adjusted to a predetermined pressure under film-forming conditions by means of the exhaust unit 5. For example, in order to increase the film formation rate, the internal pressure of the film-forming compartment 13 may be adjusted to be higher than the internal pressure of the feed-out rotary electrode compartment 11 and the take-up rotary electrode compartment 12.

When the internal pressure of respective compartments 11, 12, 13 is ensured, a predetermined negative voltage is applied to the rotary electrode reels 2 using the chamber 2 as an anode from the plasma source 3. A forward rotation control motor 223 is operated at a predetermined rpm, and a torque control motor 213 is operated so that tension is made uniform upon winding of the conductive substrate 6. Accordingly, while predetermined tension is applied to the substrate portion 63 between reels, the conductive substrate 6 is fed-out from the feed-out reel 21 and is wound on the take-up reel 22.

By applying the negative voltage to the rotary electrode reels 2, the negative voltage is also applied to the conductive substrate 6 in contact with the rotary electrode reels 2, and thus negative glow discharge is generated between the chamber 1 acting as the anode and the conductive substrate 6, so that plasma sheath P is uniformly formed along the surface of the substrate portion 63 between reels. The material gas for a film supplied into the film-forming compartment 13 is activated in the plasma sheath P around the surface of the substrate portion 63 between reels and thus contacts the surface of the substrate, thereby uniformly forming a film on the surface of the substrate portion 63 between reels.

The method of forming a film according to the present embodiment exhibits the following effects in addition to the effects of the second embodiment using the apparatus of FIG. 2 resulting from forming the film only on the surface of the substrate portion 63 between reels.

As the internal pressure of the feed-out rotary electrode compartment 11 and the take-up rotary electrode compartment 12 is reduced, the width of the plasma sheath P in the feed-out reel 21 and the take-up reel 22 is enlarged, so that the maximum electrode distance may have so large a value as possible within the range smaller than the width of the plasma sheath. Therefore, the amount of conductive substrate able to be wound between initiation of the winding and termination thereof may be increased. When a film is formed on a predetermined amount of the conductive substrate 6, the number of processes for setting the conductive substrate 6 on the apparatus for forming a film may be reduced, thus improving productivity, compared to when the maximum electrode distance is small.

Also, the internal pressure of the feed-out rotary electrode compartment 11 and the internal pressure of the take-up rotary electrode compartment 12 may be independently set, and the film-forming compartment 13 may have any internal pressure selected under film-forming conditions. So, for example, in order to increase the film formation rate, the internal pressure of the film-forming compartment 13 may be adjusted to be higher than the internal pressure of the feed-out rotary electrode compartment 11 and the internal pressure of the take-up rotary electrode compartment 12. High film formation rate may result in increased productivity.

In the method of forming a film according to the present embodiment, the internal pressure of the feed-out rotary electrode compartment 11 and the internal pressure of the take-up rotary electrode compartment 12 are set by means of the exhaust units 5, 5 so that the maximum electrode distance is smaller than the width of the plasma sheath before initiation of film formation. However, the internal pressure of the feed-out rotary electrode compartment 11 and the internal pressure of the take-up rotary electrode compartment 12 may be set by means of the exhaust units 5, 5 in accordance with the feeding-out and winding of the conductive substrate 6.

When the feeding-out of the conductive substrate 6 is carried out at the feed-out reel 21, the feed-out electrode distance between the outer surface of the feed-out substrate portion 6 and the adjacent anode 7 is increased. Upon initiation of feeding-out, the internal pressure of the feed-out rotary electrode compartment 11 is adjusted to a predetermined pressure at which the width of the plasma sheath is larger than the feed-out electrode distance by means of the exhaust unit 5. As the feeding-out of the conductive substrate 6 progresses, the feed-out electrode distance is increased. Hence, the internal pressure of the feed-out rotary electrode compartment 11 is lowered to less than what it was upon initiation of feeding-out depending on the feeding-out of the conductive substrate 6, and thus the width of the plasma sheath at the feed-out reel 21 is enlarged to more than what it was upon initiation of feeding-out. Specifically, when the feed-out electrode distance is increased, the internal pressure of the feed-out rotary electrode compartment 11 is lowered to less than what it was upon initiation of the feeding-out, and the width of the plasma sheath at the feed-out reel 21 is enlarged to more than what it was upon initiation of the feeding-out, and thereby the feed-out electrode distance is no larger than the width of the plasma sheath from initiation of the feeding-out of the conductive substrate 6 to termination thereof. When using this method, the plasma sheath P may not be formed on the outer surface of the feed-out substrate portion 61 from initiation of the feeding-out of the conductive substrate 6 to termination thereof, and the film formation is thus suppressed on the outer surface of the feed-out substrate portion 61.

When the winding of the conductive substrate 6 is carried out at the take-up reel 22, the take-up electrode distance between the outer surface of the take-up substrate portion 62 and the adjacent anode 7 is decreased. Upon initiation of the winding, the internal pressure of the take-up rotary electrode compartment 12 is adjusted to a predetermined pressure at which the width of the plasma sheath is larger than the take-up electrode distance by means of the exhaust unit 5. As the winding of the conductive substrate 6 progresses, the take-up electrode distance is decreased, and the internal pressure of the take-up rotary electrode compartment 12 may be the same as upon initiation of the winding. The internal pressure of the take-up rotary electrode compartment 12 is increased to more than what it was upon initiation of the winding in the range in which the width of the plasma sheath is no smaller than the take-up electrode distance depending on the winding of the conductive substrate 6, and thus the width of the plasma sheath at the take-up reel 22 may be made smaller than upon initiation of the winding. When using this method, the plasma sheath P may not be formed on the outer surface of the take-up substrate portion 62 from initiation of winding of the conductive substrate 6 to termination thereof, and the film formation is thus suppressed on the outer surface of the take-up substrate portion 62.

In the method of forming a film using the apparatus of FIG. 5 according to the present embodiment, the feed-out substrate portion 61 and the take-up substrate portion 62 are respectively covered with the adjacent anodes 7. Thus in the present embodiment, an anode in the feed-out electrode distance is the adjacent anode 7, and an anode in the take-up electrode distance is the adjacent anode 7. In the method of forming a film according to the present invention, an apparatus for forming a film in which the feed-out substrate portion 61 and the take-up substrate portion 62 are not covered with the adjacent anodes 7, 7 compared to the apparatus of FIG. 5 may be used. In this case, an anode in the feed-out electrode distance is the chamber 1 (specifically the feed-out rotary electrode compartment 11), and an anode in the take-up electrode distance is the chamber 1 (specifically the take-up rotary electrode compartment 12). Also the apparatus for forming a film may include a single material gas supplier 4, in which a material gas supply pipe 42 is connected to the film-forming compartment 13. In this case, the material gas supplied to the film-forming compartment 13 may include a hydrocarbon gas, etc., as mentioned above, and also may include the diluent gas as above.

In the apparatus for forming a film according to the present embodiment, portions of partitions F made of a metal are opened, and slit-forming members F1 made of an insulating material are inserted and maintained into such opened portions, but the present invention is not limited thereto. In the present invention, the partitions F are insulated from the conductive substrate 6 that passes through the slits thereof, and the slits are opened to the extent that changes in pressure of the feed-out rotary electrode compartment 11 and the take-up rotary electrode compartment 12 may be suppressed so that the maximum electrode distance is smaller than the width of the plasma sheath even when there is inflow of the material gas from the slits in the feed-out rotary electrode compartment 11 and the take-up rotary electrode compartment 12. Also the slits are opened to the extent that changes in pressure of the film-forming compartment 13 may be suppressed so that the electrode distance between the substrate portion 63 between reels and the film-forming compartment 13 is larger than the width of the plasma sheath formed along the surface of the substrate even when there is outflow of the material gas from the slits in the film-forming compartment 13. For example, openings having a predetermined size through which the conductive substrate 6 passes may be formed in the partitions F made of a metal, and an insulating film may be formed at the openings using surface treatment. In addition, for example, openings having a predetermined size through which the conductive substrate 6 passes may be formed in the partitions F made of an insulating material.

[Apparatus for Forming a Film]

The apparatus for forming a film according to the present invention is used to form a film on the surface of a conductive substrate using PECVD. Respective elements of the apparatus for forming a film according to the present invention are the same as those specified in the [Method of forming a film], and the description thereof refers to the aforementioned description.

EXAMPLES

Examples of the present invention are described below.

Example 1

A film was formed using an apparatus for forming a film as shown in FIG. 1. As a conductive substrate 6, stainless steel having a thickness of 150 μm and a width of 100 mm was used, and, as a material gas, a hydrocarbon-based gas such as pyridine and a diluent gas such as nitrogen were used.

First, the inside of a chamber 1 was evacuated up to a vacuum of $5\times10^{-3}$ pa by means of an exhaust unit 5. Subsequently, a mixture gas comprising hydrogen and argon was supplied into the chamber 1 by means of a material gas supplier 4. Then, the internal pressure of the chamber 1 was adjusted to 5 Pa by means of an exhaust controller 53. When the chamber 1 has such a predetermined internal pressure, a voltage of 300 V was applied between an anode 31 and a cathode 32 by a plasma source 3. Upon application of the voltage, glow discharge was generated around the conductive substrate 6. Then, while the temperature of the conductive substrate 6 was measured using a radiation thermometer, the internal pressure of the chamber 1 and the applied voltage were gradually increased until the temperature thereof reached about 430 degree Celsius.

When the temperature of the conductive substrate 6 was about 430 degree Celsius, pyridine in a flow rate of 70 sccm and nitrogen in a flow rate of 120 sccm were supplied into the chamber 1 by means of a flow rate controller 43 of the material gas supplier 4. While an amorphous carbon film was formed on the surface of the conductive substrate 6 under film-forming conditions including an internal pressure of the chamber 1 of 8 Pa, the applied voltage of 3000 V, and a substrate feed-out rate of 0.32 m/min, the conductive substrate 6 was continuously wound. The electrode distance between the conductive substrate 6 acting as the cathode and the chamber 1 acting as the anode was set to be larger than the width of plasma sheath. In particular, the electrode distances between both a surface and a rear surface of the substrate portion 63 between reels and the chamber 1 were set to be larger than the width of the plasma sheath formed along the surface of the substrate. The conductive substrate 6 was exposed to the plasma sheath P for about 4 min until being wound on the take-up reel 22 from the feed-out reel 21, thus forming the film thereon.

Figure 6:
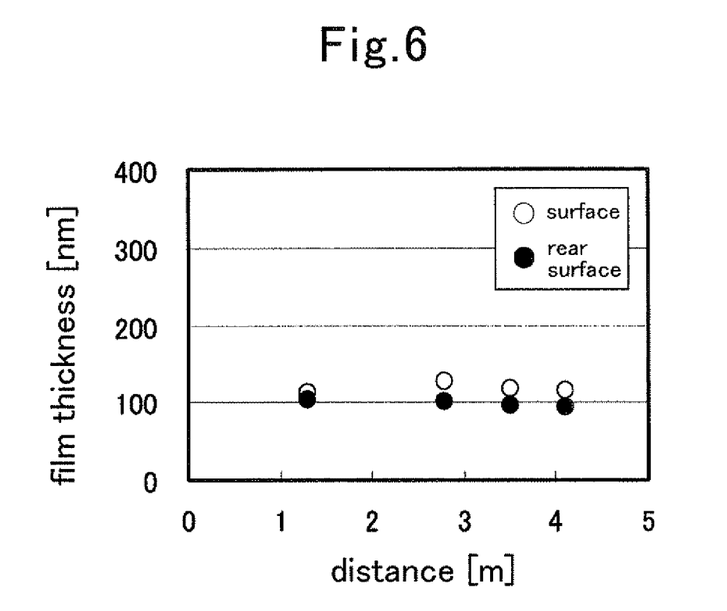
FIG. 6 shows results of measurement of the thickness of the amorphous carbon film of Example 1.

After formation of the film, the conductive substrate was cooled in the chamber 1 and the thickness of the amorphous carbon film was measured. The cross-section of the amorphous carbon film was taken using a scanning electron microscope (SEM), so that the thickness thereof was measured. The results are shown in FIG. 6. FIG. 6 shows the relationship between the distance from one end of the conductive substrate 6 fixed to the take-up reel 22 and the thickness of the amorphous carbon film. The results showed that the amorphous carbon film about 100 nm thick was uniformly formed on both surfaces of the conductive substrate 6 in the entire longitudinal direction (feeding-out, winding direction) of the conductive substrate 6.

Example 2

A film was formed using an apparatus for forming a film as shown in FIG. 2. The internal pressure of a chamber 1 during film formation was 5 Pa, and the maximum electrode distance between a feed-out substrate portion 61 acting as a cathode and an adjacent anode 7 acting as an anode and the maximum electrode distance between a take-up substrate portion 62 acting as a cathode and an adjacent anode 7 acting as an anode were 10 mm. If the feed-out substrate portion 61 and the take-up substrate portion 62 were not covered with the adjacent anodes 7, the width of plasma sheath in the feed-out substrate portion 61 and the take-up substrate portion 62 was mm. The other film-forming conditions and the film formation sequence were the same as in Example 1.

Example 3

A film was formed using an apparatus for forming a film as shown in FIG. 2. The internal pressure of a chamber 1 during film formation was 8 Pa, and the maximum electrode distance between a feed-out substrate portion 61 acting as a cathode and an adjacent anode 7 acting as an anode and the maximum electrode distance between a take-up substrate portion 62 acting as a cathode and an adjacent anode 7 acting as an anode were 10 mm. If the feed-out substrate portion 61 and the take-up substrate portion 62 were not covered with the adjacent anodes 7, the width of plasma sheath in the feed-out substrate portion 61 and the take-up substrate portion 62 was mm. The other film-forming conditions and the film formation sequence were the same as in Example 1.

Example 4

A film was formed using an apparatus for forming a film as shown in FIG. 2. The internal pressure of a chamber 1 during film formation was 3 Pa, and the maximum electrode distance between a feed-out substrate portion 61 acting as a cathode and an adjacent anode 7 acting as an anode and the maximum electrode distance between a take-up substrate portion 62 acting as a cathode and an adjacent anode 7 acting as an anode were 30 mm. If the feed-out substrate portion 61 and the take-up substrate portion 62 were not covered with the adjacent anodes 7, the width of plasma sheath in the feed-out substrate portion 61 and the take-up substrate portion 62 was mm. The other film-forming conditions and the film formation sequence were the same as in Example 1.

Example 5

A film was formed using an apparatus for forming a film as shown in FIG. 2. The internal pressure of a chamber 1 during film formation was 5 Pa, and the maximum electrode distance between a feed-out substrate portion 61 acting as a cathode and an adjacent anode 7 acting as an anode and the maximum electrode distance between a take-up substrate portion 62 acting as a cathode and an adjacent anode 7 acting as an anode were 30 mm. If the feed-out substrate portion 61 and the take-up substrate portion 62 were not covered with the adjacent anodes 7, the width of plasma sheath in the feed-out substrate portion 61 and the take-up substrate portion 62 was mm. The other film-forming conditions and the film formation sequence were the same as in Example 1.

Comparative Example 1

A film was formed using an apparatus for forming a film as shown in FIG. 2. The internal pressure of a chamber 1 during film formation was 8 Pa, and the maximum electrode distance between a feed-out substrate portion 61 acting as a cathode and an adjacent anode 7 acting as an anode and the maximum electrode distance between a take-up substrate portion 62 acting as a cathode and an adjacent anode 7 acting as an anode were 30 mm. If the feed-out substrate portion 61 and the take-up substrate portion 62 were not covered with the adjacent anodes 7, the width of plasma sheath in the feed-out substrate portion 61 and the take-up substrate portion 62 was 30 mm. The other film-forming conditions and the film formation sequence were the same as in Example 1.

The film-forming conditions, the width of plasma sheath, and whether the film was formed on the feed-out substrate portion 61 and the take-up substrate portion 62 in Examples 2 to 5 and Comparative Example 1 are shown in Table 1 below.

TABLE 1

|  | Ex. 2 | Ex. 3 | Ex. 4 | Ex. 5 | C. Ex. 1 |
|---|---|---|---|---|---|
| Internal Pressure (Pa) | 5 | 8 | 3 | 5 | 8 |
| Max. Electrode Distance (mm) | 10 | 10 | 30 | 30 | 30 |
| Width of Plasma Sheath (mm) | 40 | 30 | 50 | 40 | 30 |
| Film formation on Feed-out Substrate Portion and Take-up Substrate Portion | No | No | No | No | Yes |

In Examples 2 to 5 in which the maximum electrode distance between the feed-out substrate portion 61 acting as the cathode and the adjacent anode 7 acting as the anode and the maximum electrode distance between the take-up substrate portion 62 acting as the cathode and the adjacent anode 7 acting as the anode were smaller than the width of the plasma sheath, the film was seldom formed on the feed-out substrate portion 61 and the take-up substrate portion 62. On the other hand, in Comparative Example 1 in which the maximum electrode distance between the feed-out substrate portion 61 acting as the cathode and the adjacent anode 7 acting as the anode and the maximum electrode distance between the take-up substrate portion 62 acting as the cathode and the adjacent anode 7 acting as the anode were equal to the width of the plasma sheath, the film was formed on the feed-out substrate portion 61 and the take-up substrate portion 62.

Example 6

A film was formed using an apparatus for forming a film as shown in FIG. 5. The internal pressure of a film-forming compartment 13 during film formation was 5 Pa, and the internal pressure of a feed-out rotary electrode compartment 11 and a take-up rotary electrode compartment 12 was 1 Pa. The internal pressure was controlled by means of exhaust units 5 provided in respective compartments 11, 12, 13. The maximum feed-out electrode distance was 30 mm, and the maximum take-up electrode distance was 60 mm. If both a feed-out substrate portion 61 and a take-up substrate portion 62 were not covered with adjacent anodes 7, the width of plasma sheath in the feed-out substrate portion 61 and the take-up substrate portion 62 was 70 mm or more. A material gas supplied to the film-forming compartment 13 was composed of pyridine as a hydrocarbon-based gas and nitrogen as a diluent gas as in Example 1, Nitrogen as a diluent gas was supplied to the feed-out rotary electrode compartment 11 and the take-up rotary electrode compartment 12. The other film-forming conditions and the film formation sequence were the same as in Example 1.

Comparative Example 2

A film was formed using an apparatus for forming a film as shown in FIG. 5. The internal pressure of a film-forming compartment 13 during film formation was 5 Pa, and the internal pressure of a feed-out rotary electrode compartment 11 and a take-up rotary electrode compartment 12 was 3 Pa. The internal pressure was controlled by means of exhaust units 5 provided in respective compartments 11, 12, 13. The maximum feed-out electrode distance was 30 mm, and the maximum take-up electrode distance was 60 mm. If both a feed-out substrate portion 61 and a take-up substrate portion 62 were not covered with adjacent anodes 7, the width of plasma sheath in the feed-out substrate portion 61 and the take-up substrate portion 62 was 50 mm. The other film-forming conditions and the film formation sequence were the same as in Example 6.

The film-forming conditions, the width of plasma sheath, and whether the film was formed on the feed-out substrate portion 61 and the take-up substrate portion 62 in Example 6 and Comparative Example 2 are shown in Table 2 below.

TABLE 2

|  | Ex. 6 | C. Ex. 2 |
|---|---|---|
| Internal Pressure of Film-Forming Compartment (Pa) | 5 | 5 |
| Internal Pressure of Feed-out Rotary Electrode Compartment (Pa) | 1 | 3 |
| Max. Feed-out Electrode Distance (mm) | 30 | 30 |
| Width of Plasma Sheath at Feed-out side (mm) | 70 or more | 50 |
| Film Formation on Feed-out Substrate Portion | No | No |
| Internal Pressure of Take-up Rotary Electrode Compartment (Pa) | 1 | 3 |
| Max. Take-up Electrode Distance (mm) | 60 | 60 |
| Width of Plasma Sheath at Take-up side (mm) | 70 or more | 50 |
| Film Formation on Take-up Substrate Portion | No | Yes |

In Example 6 in which the maximum feed-out electrode distance and the maximum take-up electrode distance were smaller than the width of the plasma sheath, the film was seldom formed on the feed-out substrate portion 61 and the take-up substrate portion 62. On the other hand, in Comparative Example 2 in which the maximum take-up electrode distance was larger than the width of the plasma sheath, the film was formed on the take-up substrate portion 62.

The invention claimed is:

1. A method of forming a film on a surface of a conductive substrate with a long shape using an apparatus through plasma-enhanced chemical vapor deposition, the apparatus comprising:
a chamber,
a pair of rotary electrode reels disposed in the chamber and including a feed-out reel and a take-up reel,
a plasma source able to apply voltage using the chamber as an anode and the rotary electrode reels as a cathode,
a material gas supplier for supplying a material gas for a film into the chamber, and
an exhaust unit for vacuum-evacuating an inside of the chamber, the method comprising:
vacuum-evacuating the inside of the chamber with the exhaust unit, and
supplying the material gas into the chamber with the material gas supplier, wherein:
when the conductive substrate with a cylindrical shape wound on the feed-out reel is defined as a feed-out substrate portion, the conductive substrate with a cylindrical shape wound on the take-up reel is defined as a take-up substrate portion, and the conductive substrate positioned between the feed-out reel and the take-up reel is defined as a substrate portion between reels, a negative voltage is applied to the rotary electrode reels from the plasma source while the conductive substrate is fed-out from the feed-out reel and is wound on the take-up reel so that an entire surface of the substrate portion between reels contacts the material gas, whereby a plasma sheath is formed along the surface of the substrate portion between reels and the material gas is activated in the plasma sheath and thus contacts the surface of the substrate, thus forming the film on the surface of the substrate.

2. The method of claim 1, wherein the apparatus further comprises an adjacent anode disposed in the chamber and connected with the anode of the plasma source, in which at least one surface among both end surfaces and an outer surface of the feed-out substrate portion and both end surfaces and an outer surface of the take-up substrate portion is covered with the adjacent anode so as to enable feeding-out of the conductive substrate from the feed-out reel and/or winding thereof on the take-up reel, and an electrode distance between the surface covered with the adjacent anode and the adjacent anode is made smaller than a width of the plasma sheath.

3. The method of claim 1, wherein the chamber comprises a feed-out rotary electrode compartment that receives the feed-out reel, a take-up rotary electrode compartment that receives the take-up reel, and a film-forming compartment that receives the substrate portion between reels, which are divided by partitions with slits through which the conductive substrate passes, and at least one of internal pressure of the feed-out rotary electrode compartment and internal pressure of the take-up rotary electrode compartment is controlled by the exhaust unit or a gas flow rate so that at least one electrode distance of a feed-out electrode distance between the feed-out substrate portion and the chamber or the adjacent anode, acting as the anode, and a take-up electrode distance between the take-up substrate portion and the chamber or the adjacent anode, acting as the anode, is smaller than a width of the plasma sheath.

4. The method of claim 3, wherein at least one of the internal pressure of the feed-out rotary electrode compartment and the internal pressure of the take-up rotary electrode compartment is controlled depending on an increase/decrease in the feed-out electrode distance and the take-up electrode distance.

5. The method of claim 1, wherein the film is an amorphous carbon film.

6. The method of claim 1, wherein the conductive substrate comprises a metal foil made of any one selected from among stainless steel, aluminum, copper and titanium.

7. The method of claim 1, wherein:
- the plasma sheath is formed along the entire surface if the substrate portion between the reels; and
- the material gas is activated in the plasma sheath and thus contacts the surface of the substrate, thus forming the film on the entire surface of the substrate portion between the reels.

* * * * *